US010115365B2

(12) United States Patent
Kim et al.

(10) Patent No.: US 10,115,365 B2
(45) Date of Patent: *Oct. 30, 2018

(54) GATE DRIVING CIRCUIT AND DISPLAY APPARATUS HAVING THE SAME

(71) Applicant: Samsung Display Co., Ltd., Yongin-si (KR)

(72) Inventors: Beom-Jun Kim, Seoul (KR); Myung-Koo Hur, Asan-si (KR); Bong-Jun Lee, Seoul (KR); Yeon-Kyu Moon, Asan-si (KR); Myung-Sub Lee, Seoul (KR); Gyu-Tae Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/231,246

(22) Filed: Aug. 8, 2016

(65) Prior Publication Data

US 2016/0351158 A1 Dec. 1, 2016

Related U.S. Application Data

(63) Continuation of application No. 13/485,243, filed on May 31, 2012, now Pat. No. 9,412,315.

(30) Foreign Application Priority Data

Sep. 9, 2011 (KR) .................. 10-2011-0091698

(51) Int. Cl.
*G09G 3/36* (2006.01)
*G11C 19/28* (2006.01)
*H03K 17/693* (2006.01)

(52) U.S. Cl.
CPC ............. *G09G 3/3688* (2013.01); *G09G 3/36* (2013.01); *G09G 3/3677* (2013.01); *G11C 19/28* (2013.01);

(Continued)

(58) Field of Classification Search
CPC ...... G09G 3/30–3/3208; G09G 3/3225; G09G 3/3266–3/3291; G09G 3/36;
(Continued)

(56) References Cited

U.S. PATENT DOCUMENTS

| 2006/0267912 A1 | 11/2006 | Lee et al. |
| 2010/0164854 A1 | 7/2010 | Kim et al. |
| 2010/0277206 A1 | 11/2010 | Lee et al. |

FOREIGN PATENT DOCUMENTS

KR 1020080062182 7/2008

OTHER PUBLICATIONS

Non-Final Office Action dated Nov. 10, 2014 in related U.S. Appl. No. 13/485,234.

(Continued)

*Primary Examiner* — Nathan Danielsen
(74) *Attorney, Agent, or Firm* — H.C. Park & Associates, PLC

(57) ABSTRACT

A gate driving circuit including a plurality of stages connected with each other and configured to output a plurality of gate signals. An n-th (n is a natural number) stage including a gate output part including a first transistor connected between a clock signal and an output node outputting an n-th gate signal, the first transistor having a gate electrode connected to a control node, a carry part connected between the clock signal and a carry node outputting an n-th carry signal, a first node control part connected between the output node and a first low voltage, and a second node control part including at least one transistor connected between the control node and a second low voltage different from the first low voltage.

9 Claims, 11 Drawing Sheets

(52) U.S. Cl.
CPC ... *H03K 17/693* (2013.01); *G09G 2300/0426* (2013.01); *G09G 2310/0251* (2013.01); *G09G 2310/0291* (2013.01); *G09G 2310/08* (2013.01)

(58) Field of Classification Search
CPC .. G09G 3/3611; G09G 3/3674–3/3696; G09G 2300/0421; G09G 2300/0426; G09G 2310/0251; G09G 2300/0291; G09G 2300/08
See application file for complete search history.

(56) References Cited

OTHER PUBLICATIONS

Final Office Action dated May 8, 2015 in related U.S. Appl. No. 13/485,243.
Non-Final Office Action dated Jul. 27, 2015 in related U.S. Appl. No. 13/485,243.
Final Office Action dated Feb. 2, 2016 in related U.S. Appl. No. 13/485,243.
Notice of Allowance dated Apr. 5, 2016 in related U.S. Appl. No. 13/485,243.

GATE DRIVING CIRCUIT AND DISPLAY APPARATUS HAVING THE SAME

CROSS REFERENCE TO RELATED APPLICATION

This application is a continuation of U.S. patent application Ser. No. 13/485,243, filed on May 31, 2012, now issued as U.S. Pat. No. 9,412,315, which claims priority from and the benefit of Korean Patent Application No. 10-2011-0091698, filed on Sep. 9, 2011, all of which are hereby incorporated by reference for all purposes as if fully set forth herein.

BACKGROUND OF THE INVENTION

Field of the Invention

Exemplary embodiments of the present invention relate to a gate driving circuit and a display apparatus having the gate driving circuit. More particularly, exemplary embodiments of the present invention relate to a gate driving circuit with an improved gate signal and a display apparatus having the gate driving circuit.

Discussion of the Background

Generally, a liquid crystal display (LCD) apparatus includes an LCD panel displaying an image using a transmissivity of a liquid crystal, and a backlight assembly disposed under the LCD panel and providing light to the LCD panel.

The LCD panel includes a plurality of gate lines, a plurality of data lines, and a plurality of pixels. The LCD apparatus may further include a gate driving circuit providing a gate signal to the gate lines and a data driving circuit providing a data signal to the data lines. The gate and data driving circuits are conventionally mounted on the LCD panel with a chip shape.

The gate driving circuit may be integrated on a glass-based display substrate of the LCD panel with an amorphous silicon gate (ASG) type, to decrease an entire size of the gate driving circuit and to improve productivity. The above-mentioned ASG-type gate driving circuit may decrease cost prices of manufacturing the LCD panel having a relatively small or medium size but may not have a strong signal.

SUMMARY OF THE INVENTION

Exemplary embodiments of the present invention provide a gate driving circuit capable of improving a signal of a control node of a gate driving circuit.

Exemplary embodiments of the present invention also provide a display apparatus having the gate driving circuit.

Additional features of the invention will be set forth in the description which follows, and in part will be apparent from the description, or may be learned by practice of the invention.

Exemplary embodiments of the present invention disclose a gate driving circuit including a plurality of stages connected with each other and configured to output a plurality of gate signals. An n-th (n is a natural number) stage includes a gate output part, a first node control part, and a carry part. The gate output part includes a first transistor to provide a high voltage of a clock signal to an n-th gate signal in response to a high voltage of a control node. The first node control part is connected to the control node to control a signal of the control node and includes at least one transistor having a channel length longer than a channel length of the first transistor. The carry part provides the high voltage of the clock signal to an n-th carry signal in response to the high voltage of the control node.

Exemplary embodiments of the present invention also disclose a display apparatus including a display panel, a source driving circuit, and a gate driving circuit. The display panel has a display area in which an image is displayed and a peripheral area surrounding the display area. Gate lines and source lines are disposed in the display area, and the gate lines are crossing the source lines. The source driving circuit provides data signals to the source lines and the gate driving circuit is in the peripheral area and includes a plurality of stages providing gate signals to the gate lines. An n-th stage (n is a natural number) of the plurality of stages includes a gate output part, a node control part, and a carry part. The gate output part includes a first transistor to provide a high voltage of a clock signal to a high voltage of an n-th gate signal in response to a high voltage of a control node. The node control part is connected to the control node to control a signal of the control node and includes at least one transistor having a channel longer than that of the first transistor. The carry part outputs the high voltage of the clock signal to an n-th carry signal in response to the signal of the control node.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
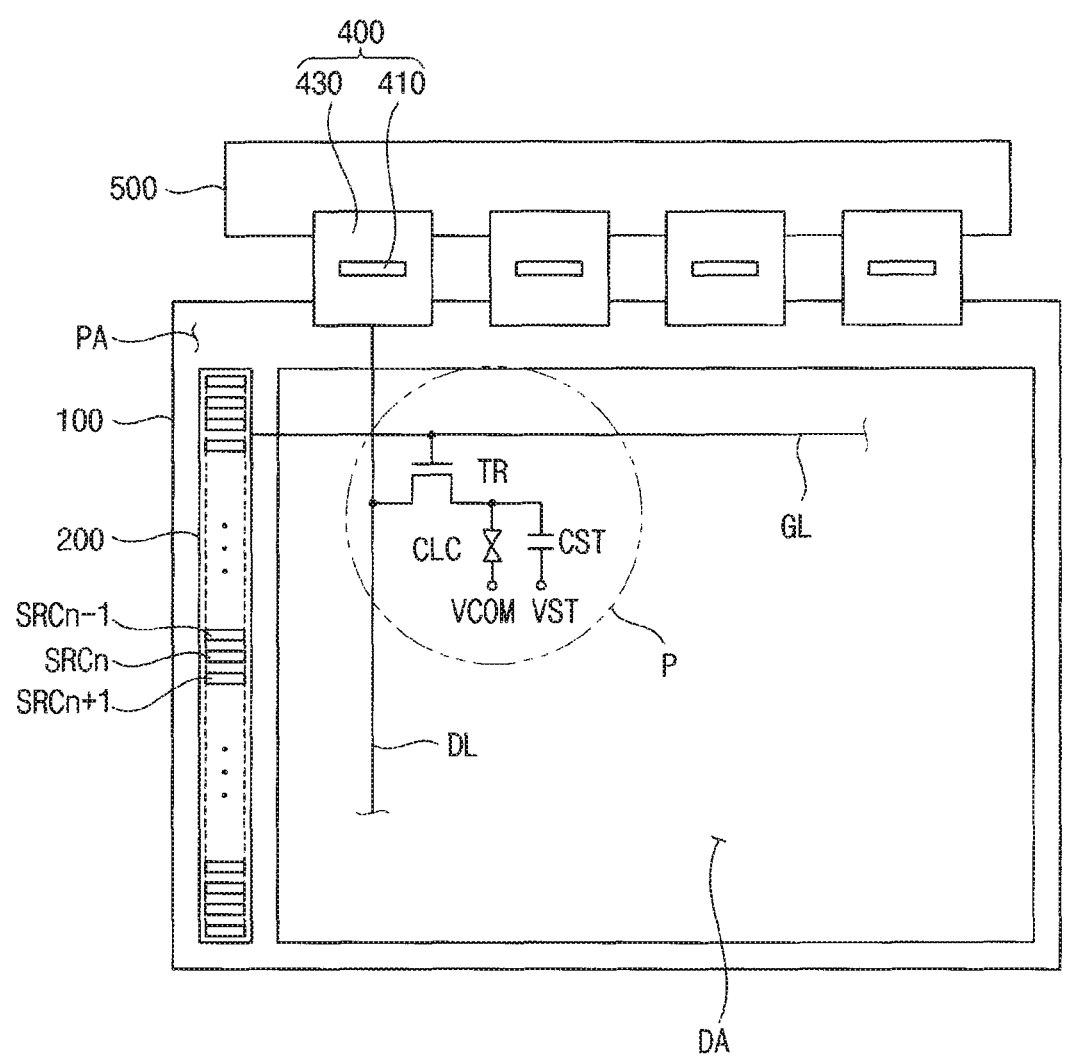
FIG. 1 is a plan view illustrating a display apparatus according to exemplary embodiments of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region, or substrate is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. It should be understood that for the purposes of this disclosure, "at least one of X, Y, and Z" can be construed as X only, Y only, Z only, or any combination of two or more items X, Y, and Z (e.g., XYZ, XYY, YZ, ZZ).

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained in detail with reference to the accompanying drawings.

FIG. 1 is a plan view illustrating a display apparatus according to exemplary embodiments of the present invention.

Referring to FIG. 1, the display apparatus may include a display panel 100, a gate driving circuit 200, a data driving circuit 400, and a printed circuit board (PCB) 500.

The display panel 100 may include a display area DA and a peripheral area PA surrounding the display area DA. Gate lines and data lines may cross each other, and a plurality of pixel portions may be formed in the display area DA. Each of the pixel portions P may include a switching element TR electrically connected to the gate lines GL and data lines DL, a liquid crystal capacitor CLC electrically connected to the switching element TR, and a storage capacitor CST connected to the liquid crystal capacitor CLC in parallel.

The gate driving circuit 200 may include a shift resistor sequentially outputting gate signals having a high voltage to the gate lines, respectively. The shift resistor may include a plurality of stages SRCn−1, SRCn, and SRCn+1 (n is a natural number). The gate driving circuit 200 may be integrated in the peripheral area PA disposed at end portions of the gate lines. In some cases (not shown), the gate driving circuit 200 may be integrated in the peripheral area PA disposed at both end portions of the gate lines.

The data driving circuit 400 may include a data driving chip 410 outputting data signals to the data lines, respectively, and a flexible printed circuit board (FPC) 430 on which the data driving chip 410 is mounted to electrically connect the PCB 500 to the display panel 100. In some cases (not shown), the data driving chip 410 may be directly mounted on the display panel 100, or the data driving chip 410 may be directly integrated in the peripheral area PA of the display panel 100.

Figure 2:
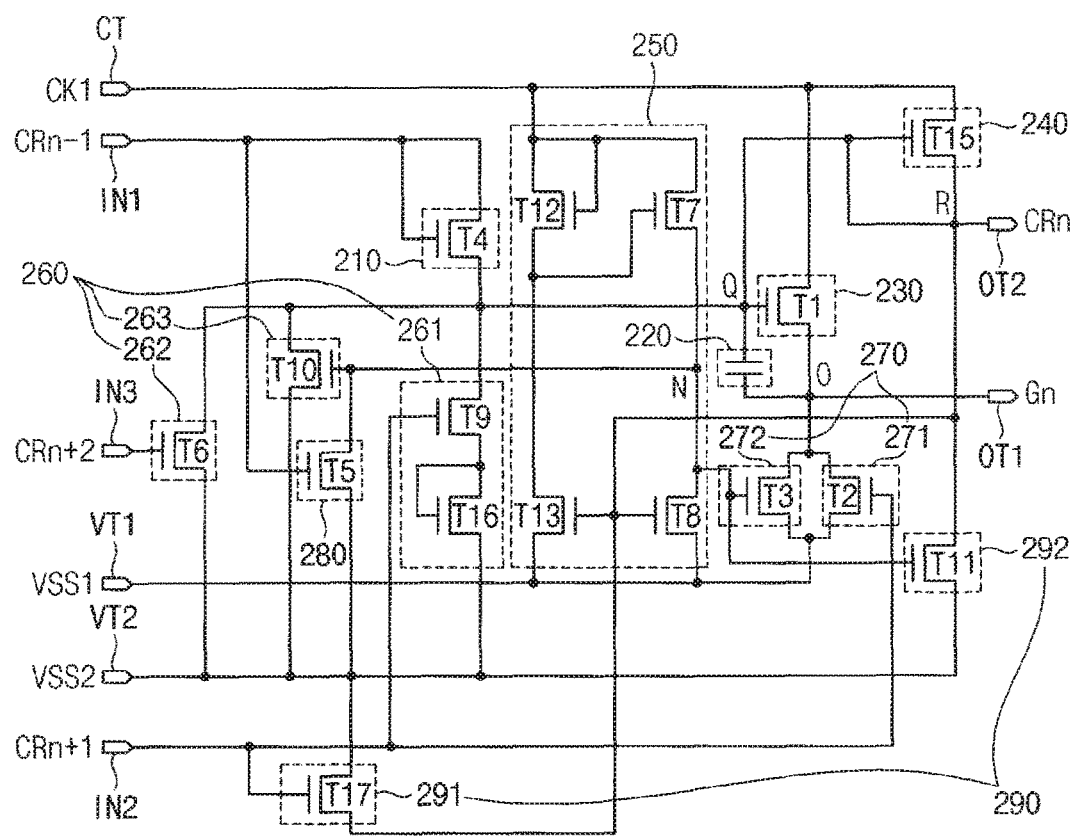
FIG. 2 is an equivalent circuit diagram of a stage in FIG. 1 according to exemplary embodiments of the present invention.
Figure 3A:
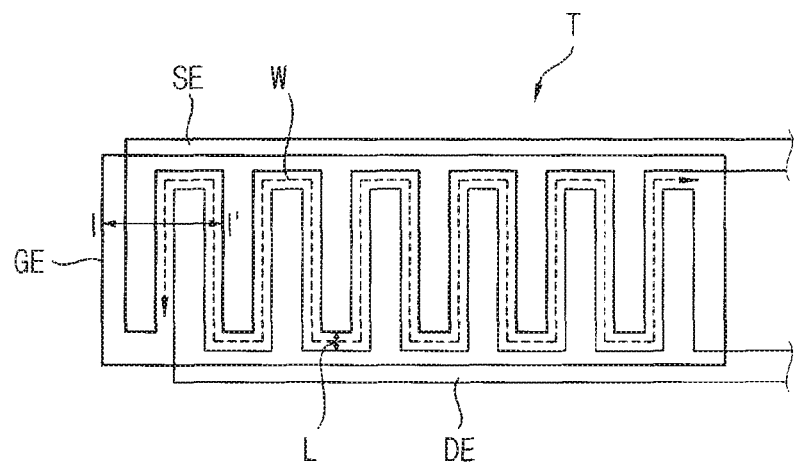
FIG. 3A is a plan view illustrating a transistor in FIG. 2 according to exemplary embodiments of the present invention.
Figure 3B:
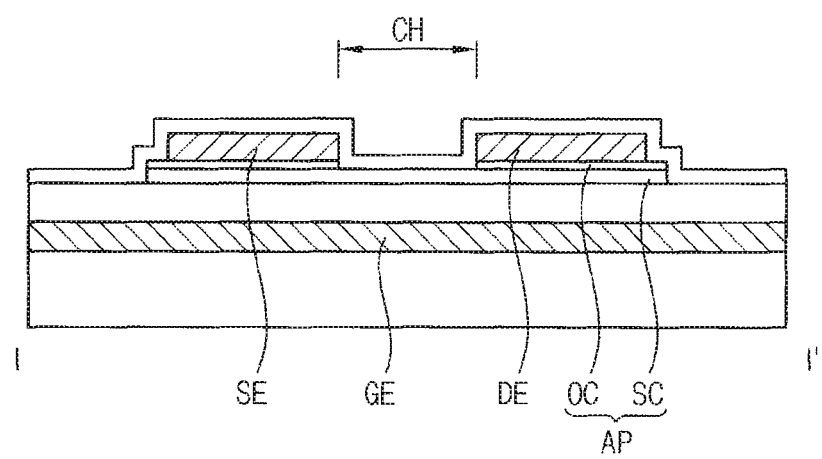
FIG. 3B is a cross-sectional view illustrating the transistor in FIG. 2 according to exemplary embodiments of the present invention.

FIG. 2 is an equivalent circuit diagram of a stage in FIG. 1 according to exemplary embodiments of the present invention. FIG. 3A is a plan view illustrating a transistor in FIG. 2, and FIG. 3B is a cross-sectional view illustrating the transistor in FIG. 2 according to exemplary embodiments of the present invention.

Referring to FIG. 1 and FIG. 2, the gate driving circuit 200 may include a shift resistor, and the shift resistor may include first to m-th stages SRC1, . . . , SRCm cascade-connected with each other (m is any positive whole number). The shift resistor may further include at least one dummy stage prior to the first stage or next to the m-th stage.

For example, an n-th stage SRCn may include a clock terminal CT, a first input terminal IN1, a second input terminal IN2, a third input terminal IN3, a first voltage terminal VT1, a second voltage terminal VT2, a first output terminal OT1, and a second output terminal OT2.

The clock terminal CT may receive a first clock signal or a second clock signal different from the first clock signal. For example, the second clock signal may have a phase opposite to the phase of the first clock signal. Hereinafter, the first clock signal is referred to as a clock signal CK, and the second clock signal is referred to as a reversed clock signal CKB.

The clock terminals CT of odd-numbered stages SRC1, SRC3, SRC5, . . . receive the clock signal CK, and the clock terminals CT of even-numbered stages SRC2, SRC4, SRC6, . . . receives the reversed clock signal CKB. Each of the clock signal CK and the reversed clock signal CKB may include a high voltage VDD and a first low voltage VSS1.

The first input terminal IN1 may receive a carry signal of one of the previous stages. For example, the input terminal IN1 of the n-th stage receives an (n−1)-th carry signal CRn−1. As for the first stage SRC1, the first input terminal IN1 may receive the vertical start signal STV.

The second input terminal IN2 may receive a carry signal of one of the next stages. For example, the second input terminal IN2 of the n-th stage receives an (n+1)-th carry signal CRn+1.

The third input terminal IN3 may receive a carry signal of one of the stages next to the stage in which the second input terminal IN2 receives the carry signal. For example, the third input terminal IN3 of the n-th stage may receive an (n+2)-th carry signal CRn+2.

The first voltage terminal VT1 may receive the first low voltage VSS1. The first low voltage VSS1 has a first low level, and the first low level may correspond to a discharging level of the gate signal.

The second voltage terminal VT2 may receive a second low voltage VSS2 having a second low level lower than the first low level of the first low voltage VSS1. The second low level corresponds to a discharging level of a control node Q (hereinafter, Q node) included in the stage.

The first output terminal OT1 is electrically connected to an n-th gate line, and outputs an n-th gate signal Gn.

The second output terminal OT2 outputs an n-th carry signal CRn. The second output terminal OT2 is connected to at least one stage of the next stages, and connected to at least two stages of the previous stages.

The n-th stage SRCn may include a plurality of transistors T1, T2, . . . , T17.

FIG. 3A is a plan view illustrating a transistor in FIG. 2 according to exemplary embodiments of the present invention.

FIG. 3B is a cross-sectional view illustrating the transistor in FIG. 2 according to exemplary embodiments of the present invention.

Referring to FIG. 3A and FIG. 3B, each of the transistors T may include a gate electrode GE, an active pattern AP, a source electrode SE and a drain electrode DE. A channel CH is defined by a separate area between the source and drain electrodes SE and DE, and the channel CH has a channel width W and a channel length L. The active pattern AP may include a semiconductor layer SC and an ohmic contact layer OC. The ohmic contact layer OC is disposed between the semiconductor layer SC and the source electrode SE or the drain electrode DE, and is removed in the channel CH. Although not shown in FIGS. 3A and 3B, when the semiconductor layer SC includes an oxide semiconductor, the ohmic contact layer OC may not be formed.

Each of the transistors T1, T2, . . . , T17 has a channel width W and a channel length L. At least one of the fourth, sixth, ninth, and tenth transistors T4, T6, T9, and T10 connected to the Q node Q, which is the control node of the n-th stage, has a channel length longer than that of the first transistor T1, which is a main transistor.

Referring to FIG. 2, the transistors T1, T2, . . . , T17 of the n-th stage SRCn are driven as a buffer part 210, a charging/discharging part 220, a gate output part 230, a carry part 240, an inverting part 250, a first node control part 260, a second node control part 270, a third node control part 280, and a fourth node control part 290.

The buffer part 210 transmits the (n−1)-th carry signal CRn−1 to the gate output part 230. The buffer part 210 may include the fourth transistor T4. The fourth transistor T4 may include control and input terminals connected to the first input terminal IN1, and an output terminal connected to the Q node Q. The channel length of the fourth transistor T4 connected to the Q node Q may be substantially the same as or longer than those of other transistors except for the fifth and twelfth transistors T5 and T12. For example, the channel length of the fourth transistor T4 may be between about 3.5 μm and about 5 μm.

The charging/discharging part 220 may be charged in response to receiving the (n−1)-th carry signal CRn−1. A first end of the charging/discharging part 220 is connected to the Q node Q, and a second end of the charging/discharging part 220 is connected to an output node O of the gate signal. When the buffer part 210 receives the high voltage VDD of the (n−1)-th carry signal CRn−1, the charging/discharging part 220 is charged with a first voltage V1 corresponding to the high voltage VDD. The charging/discharging part 220 may include any suitable charging/discharging element including, for example, a capacitor.

The gate output part 230 outputs the n-th gate signal Gn. The gate output part 230 may include the first transistor T1. The first transistor T1 may include a control electrode connected to the Q node Q, an input electrode connected to the clock terminal CT, and an output electrode connected to the output node O. The output node O is connected to the first output terminal OT1. The channel length of the first transistor T1 may be about 3.5 μm. The channel length of the first transistor T1 may be variously changed according to a resolution of an exposure and a capacity of an etching process. For example, the channel length of the first transistor T1 may be selected in a range between about 3.0 μm and about 4.0 μm.

When the first voltage V1 charged in the charging/discharging part 220 is applied to the control electrode of the gate output part 230 and the clock terminal CT receives a high voltage of the clock signal CK, the gate output part 230 is bootstrapped. When a second voltage VB of the Q node Q is applied to the control electrode of the gate output part 230, the high voltage of the clock signal CK is outputted as the high voltage of the n-th gate signal Gn. The n-th gate signal Gn is outputted to the first output terminal OT1 connected to the output node O.

The carry part 240 outputs the carry signal. The carry part 240 may include the fifteenth transistor T15. The fifteenth transistor T15 may include a control electrode connected to the Q node Q, an input electrode connected to the clock terminal CT, and an output terminal connected to the carry node R. The carry node R is connected to a second output terminal OT2.

The carry part 240 may further include a capacitor connecting the control electrode to the output electrode. The carry part 240 outputs the high voltage of the clock signal CK received to the clock terminal CT to the n-th carry signal CRn, when the high voltage is applied to the Q node Q. The n-th carry signal CRn is outputted through the second output terminal OT2 connected to the carry node R. The channel length of the fifteenth transistor T15 may be about 3.5 μm.

The inverting part 250 may include the twelfth transistor T12, the seventh transistor T7, the thirteenth transistor T13, and the eighth transistor T8. The inverting part 250 may maintain the first low voltage VSS1 during a high voltage period of the carry node R, and may apply a signal synchronized with the clock signal CK applied to the clock terminal CT to an inverting node N during a remaining frame period except for the high voltage period.

The twelfth transistor T12 may include control and input electrodes connected to the clock terminal CT, and an output electrode connected to an input electrode of the thirteenth transistor T13 and a control electrode of the seventh transistor T7. The channel length of the twelfth transistor T12 may be about 15 μm. The seventh transistor T7 may include a control electrode connected to the thirteenth transistor T13, an input electrode connected to the clock terminal CT, and an output electrode connected to an input electrode of the eighth transistor T8. The channel length of the seventh transistor T7 may be about 3.5 μm. The output electrode of the seventh transistor T7 is connected to the N node N. The thirteenth transistor T13 may include a control electrode connected to the carry node R, an input electrode connected to the twelfth transistor T12, and an output electrode connected to the first voltage terminal VT1. The channel length of the thirteenth transistor T13 may be about 3.5 μm. The eighth transistor T8 may include a control electrode connected to the carry node R, an input electrode connected to the N node N, and an output electrode connected to the first voltage terminal VT1. The channel length of the eighth transistor T8 may be about 3.5 μm.

The first node control part 260 may include a first discharging part 261, a second discharging part 262, and a first maintaining part 263, and may control a signal applied to the Q node Q.

The first discharging part 261 may include the ninth transistor T9 and the sixteenth transistor T16. The ninth transistor T9 may include a control electrode connected to the second input terminal IN2, an input electrode connected to the Q node Q, and an output electrode connected to the second voltage terminal VT2 through the sixteenth transistor T16. The sixteenth transistor T16 may include control and input electrodes connected to an output electrode of the ninth transistor T9, and an output electrode connected to the second voltage terminal VT2. The first discharging part 261 discharges the voltage of the Q node Q to the second low voltage VSS2 applied to the second voltage terminal VT2, in response to the high voltage of the (n+1)-th carry signal CRn+1. The channel length of the ninth transistor T9 connected to the Q node Q is larger than the channel length of other transistors except for the fifth and twelfth transistors T5 and T12. For example, the channel length of the ninth transistor T9 may be between about 4 μm and about 5 μm, and the channel length of the sixteenth transistor T16 may be about 3.5 μm.

The second discharging part 262 may include the sixth transistor T6. The sixth transistor T6 includes a control electrode connected to the third input terminal IN3, an input electrode connected to the Q node Q, and an output electrode connected to the second voltage terminal VT2. The second discharging part 262 discharges the voltage of the Q node Q to the second low voltage VSS2 in response to the high voltage of the (n+2)-th carry signal CRn+2. The channel length of the sixth transistor T6 connected to the Q node Q may be larger than the channel length of other transistors except for the fifth and twelfth transistors T5 and T12. For example, the channel length of the sixth transistor T6 may be between about 4 μm and about 5 μm.

The first maintaining part 263 may include the tenth transistor T10. The tenth transistor T10 may include a control electrode connected to the inverting node N, an input electrode connected to the Q node Q, and an output electrode connected to the second voltage terminal VT2. The first maintaining part 263 provides the signal of the Q node Q to the second low voltage VSS2 in response to the high voltage of the inverting node N. The channel length of the tenth transistor T10 may be larger than the channel length of other transistors except for the fifth and twelfth transistors T5 and T12. For example, the channel length of the tenth transistor T10 may be between about 4 μm and about 5 μm.

The second node control part 270 may include a third discharging part 271 and a second maintaining part 272, and controls a signal applied to the output node O.

The third discharging part 271 may include the second transistor T2. The second transistor T2 may include a control electrode connected to the second input terminal IN2, an input electrode connected to the output electrode O, and an output electrode connected to the first voltage terminal VT1. The third discharging part 271 discharges the n-th gate signal Gn, which is the signal of the output node O, to the first low voltage VSS1, in response to the high voltage of the (n+1)-th carry signal CRn+1. The channel length of the second transistor T2 may be about 3.5 μm.

The second maintaining part 272 may include the third transistor T3. The third transistor T3 may include a control electrode connected to the inverting node N, an input electrode connected to the output node O, and an output electrode connected to the first voltage terminal VT1. The second maintaining part 272 provides the n-th gate signal Gn to the first low voltage VSS1 in response to the high voltage of the inverting node N. The channel length of the third transistor T3 may be about 3.5 μm.

The third node control part 280 may include a fifth transistor T5, and may control a signal to the inverting node N.

The fifth transistor T5 may include a control electrode connected to the first input terminal IN1, an input electrode connected to the inverting node N, and an output electrode connected to the second voltage terminal VT2. The third node control part 280 discharges the voltage of the inverting node N to the second low voltage VSS2 in response to the high voltage of the (n−1)-th carry signal CRn−1. The channel length of the fifth transistor T5 may be about 15 μm.

The fourth node control part 290 may include a fourth discharging part 291 and a third maintaining part 292, and may control the signal applied to the carry node R.

The fourth discharging part 291 may include the seventeenth transistor T17. The seventeenth transistor T17 may include a control electrode connected to the second input terminal IN2, an input electrode connected to the carry node R, and an output electrode connected to the second voltage terminal VT2. The fourth discharging part 291 discharges the n-th carry signal CRn to the second low voltage VSS2 in response to the high voltage of the (n+1)-th carry signal CRn+1. The channel length of the seventeenth transistor T17 may be about 3.5 μm.

The third maintaining part 292 may include an eleventh transistor T11. The eleventh transistor T11 may include a control electrode connected to the inverting node N, an input electrode connected to the carry node R, and an output electrode connected to the second voltage terminal VT2. The third maintaining part 292 provides the n-th carry signal CRn to the second low voltage VSS2 in response to the high voltage of the inverting node N. The channel length of the eleventh transistor T11 may be about 3.5 µm.

Figure 4:
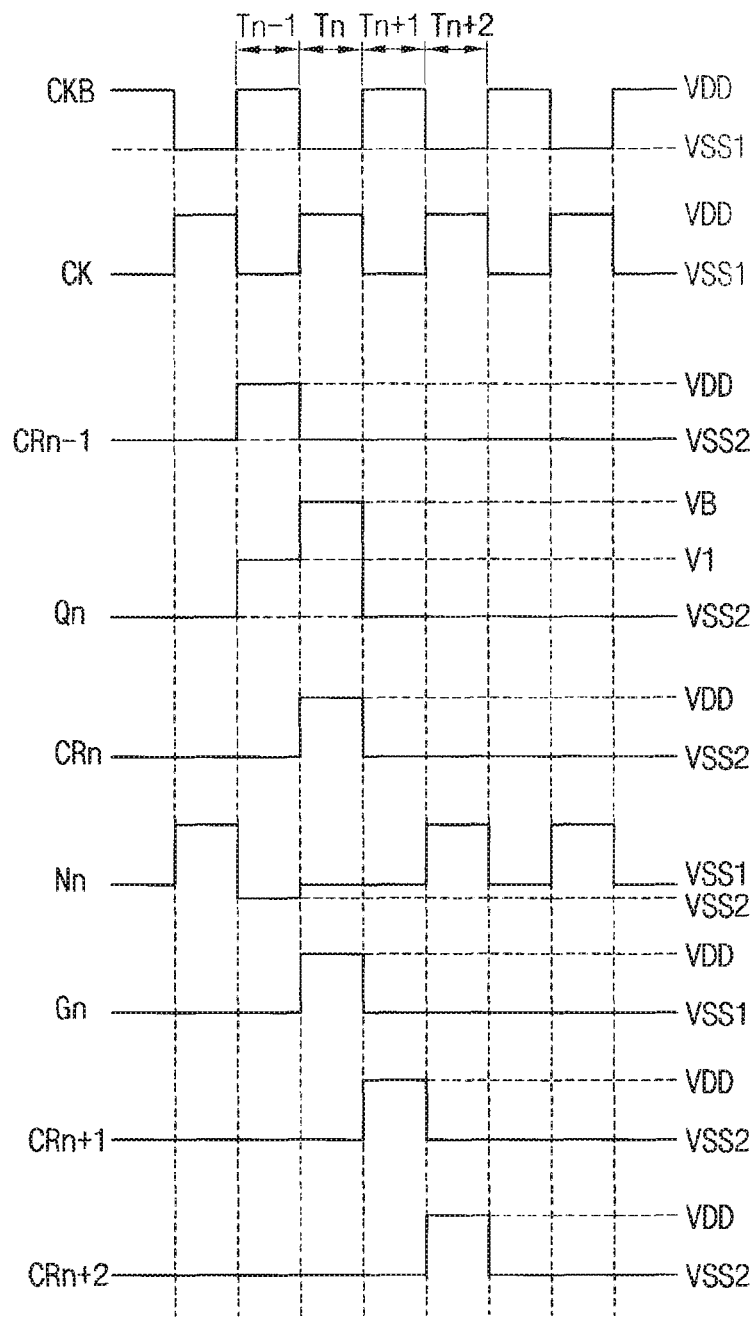
FIG. 4 is a waveform diagram of signals of the stage in FIG. 2 according to exemplary embodiments of the present invention.

FIG. 4 is a waveform diagram of signals of the stage in FIG. 2 according to exemplary embodiments of the present invention.

Referring to FIG. 2 and FIG. 4, when the first input terminal receives the high voltage of the (n−1)-th carry signal CRn−1 during an (n−1)-th period Tn−1 of one frame, the fourth transistor T4 applies the high voltage VDD of the (n−1)-th carry signal CRn−1 to the charging/discharging part 220. The first voltage V1 is applied to the Q node Q connected to the charging/discharging part 220. The fifth transistor T5 maintains the signal of the inverting node N to the second low voltage VSS2.

When the high voltage VDD of the clock signal CK is inputted to the first transistor T1 during an n-th period Tn, the first transistor T1 is bootstrapped. At this time, the second voltage VB is applied to the Q node Q, and the first transistor T1 outputs the high voltage VDD of the n-th gate signal Gn in response to the second voltage VB. In addition, the fifteenth transistor T15 outputs the high voltage VDD of the n-th carry signal CRn in response to the second voltage VB of the Q node Q. The inverting part 250 discharges the voltage of the inverting node N to the first low voltage VSS1 in response to the high voltage VDD of the carry node R.

When the second input terminal IN2 receives the high voltage VDD of the (n+1)-th carry signal CRn+1 during an (n+1)-th period Tn+1, the ninth and sixteenth transistors T9 and T16 are turned on and discharges the voltage of the Q node Q to the second low voltage VSS2. The second transistor T2 discharges the signal of the output node O to the first low voltage VSS1, and the seventeenth transistor T17 discharges the signal of the carry node R to the second low voltages VSS2.

The third input terminal IN3 may receive the high voltage VDD of the (n+2)-th carry signal CRn+2 during an (n+2)-th period Tn+2, the sixth transistor T6 discharges the signal of the Q node Q to the second low voltage VSS2.

During frames after the (n+2)-th period Tn+2, in response to the high voltage of the inverting node N, the tenth transistor T10 maintains the Q node Q to the second low voltage VSS2, the third transistor T3 maintains the output node O to the first low voltage VSS1, and the eleventh transistor T11 maintains the carry node R to the second low voltage VSS2.

In a method for driving the Q node Q of the n-th stage SRCn, the signal of the Q node Q is boosted up to the second voltage VB during the n-th period Tn. The channel length of at least one transistor connected to the Q node Q is larger than that of the first transistor TR1, so that at least one transistor connected to the Q node Q is forced to be driven and the second voltage VB is prevented from being decreased due to a leaking current. Thus, the second voltage VB of the Q node Q boosted up during the n-th period Tn is stably maintained.

FIGS. 5A, 5B, 5C, and 5D are circuit diagrams of transistors T4, T10, T6 and T9 operated during a boost-up period in FIG. 4 according to exemplary embodiments of the present invention.

Figure 5A:
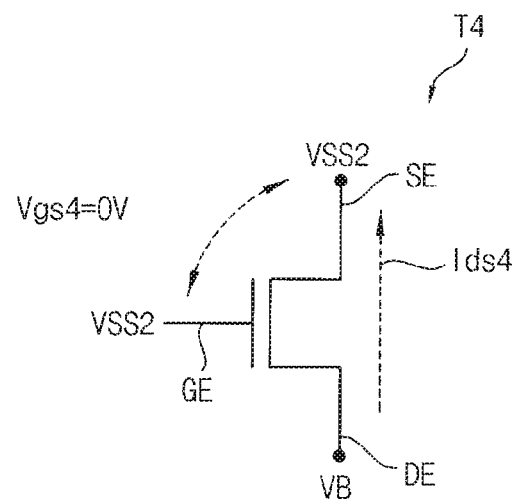
FIGS. 5A, 5B, 5C, and 5D are circuit diagrams of the transistor operated during a boost-up period in FIG. 4 according to exemplary embodiments of the present invention.
Figure 5B:
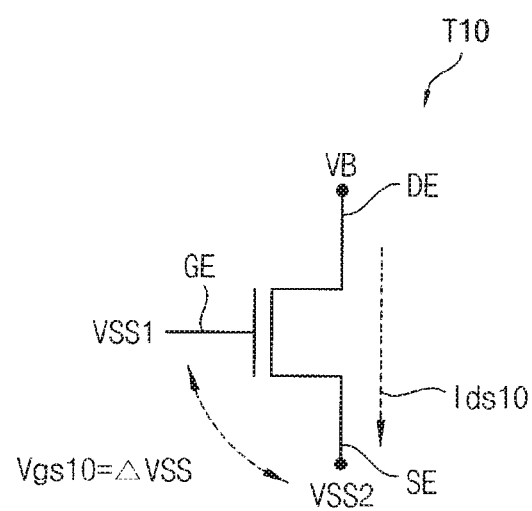
Figure 5C:
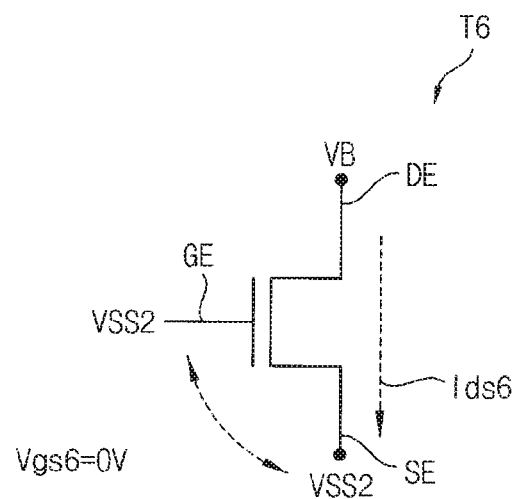
Figure 5D:
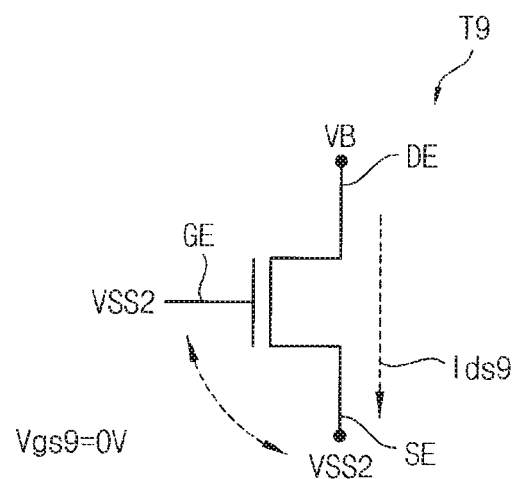

Referring to FIG. 5A and FIG. 5D, the fourth, sixth, ninth and tenth transistors T4, T6, T9, and T10 are connected to the Q node Q.

The second low voltage VSS2 of the (n−1)-th carry signal CRn−1 is applied to gate and source electrodes GE and SE of the fourth transistor T4 during the n-th period Tn, and the boosted-up second voltage VB is applied to a drain electrode DE. The fourth transistor T4 has a gate-source voltage Vgs4 of about 0V between the gate and source electrodes GE and SE, and a drain-source current Ids4 flowing between the drain and source electrodes DE and SE. The channel length of the fourth transistor T4 is larger than that of the first transistor T1 by about 10% to about 50%, and thus the drain-source current Ids4 may be decreased. For example, the channel length of the fourth transistor T4 may be between about 4 µm and about 5 µm. The fourth transistor T4 provides the first voltage V1 to the Q node Q, for a boost-up driving during the (n−1)-th period Tn−1. Thus, an elongated channel length may cause driving quality to be decreased, and the boost-up driving may malfunction. Thus, if the first voltage V1 applied to the Q node Q is enough for the boost-up driving, the channel length of the fourth transistor T4 may be between about 4 µm and about 5 µm which is larger than that of the first transistor T1. However, if the first voltage V1 applied to the Q node Q is not enough for the boost-up driving, the channel length of the fourth transistor T4 may be substantially same as that of the first transistor T1, for example, about 3.5 µm.

During the n-th period Tn, the first low voltage VSS1 of the inverting node N is applied to a gate electrode GE of the tenth transistor T10, the second voltage VB is applied to a drain electrode DE of the tenth transistor T10, and the second low voltage VSS2 applied to the second voltage terminal VT2 is applied to a source electrode SE of the tenth transistor T10. The tenth transistor T10 has a gate-source voltage Vgs10 of a voltage difference ΔVSS between the gate and source electrodes GE and SE, and a drain-source current Ids10 flowing between the drain and source electrodes DE and SE. The channel length of the tenth transistor T10 is larger than that of the first transistor T1 by about 10% to about 50%, and thus the drain-source current Ids10 may be decreased. For example, the channel length of the tenth transistor T10 may be between about 4 µm and about 5 µm.

During the n-th period Tn, the second low voltage VSS2 of the (n+2)-th carry signal CRn+2 is applied to a gate electrode GE of the sixth transistor T6, the second voltage VB is applied to a drain electrode DE of the sixth transistor T6, and the second low voltage VSS2 applied to the second voltage terminal VT2 is applied to a source electrode SE of the sixth transistor T6. The sixth transistor T6 has a gate-source voltage Vgs6 of about 0 V between the gate and source electrodes GE and SE, and a drain-source current Ids6 flowing between the drain and source electrodes DE and SE. The channel length of the sixth transistor T6 is larger than that of the first transistor T1 by about 10% to about 50%, and thus the drain-source current Ids6 may be decreased. For example, the channel length of the sixth transistor T6 may be between about 4 µm and about 5 µm.

During the n-th period Tn, the second low voltage VSS2 of the (n+1)-th carry signal CRn+1 is applied to a gate electrode GE of the ninth transistor T9, the second voltage VB is applied to a drain electrode DE of the ninth transistor T9, and the second low voltage VSS2 applied to the second voltage terminal VT2 is applied to a source electrode SE of the ninth transistor T9. The ninth transistor T9 has a gate-source voltage Vgs9 of about 0 V between the gate and source electrodes GE and SE, and a drain-source current Ids9 flowing between the drain and source electrodes DE and SE. The channel length of the ninth transistor T9 is larger than that of the first transistor T1 by about 10% to about 50%, and thus the drain-source current Ids9 may be decreased. For example, the channel length of the ninth transistor T9 may be between about 4 µm and about 5 µm.

Figure 6A:
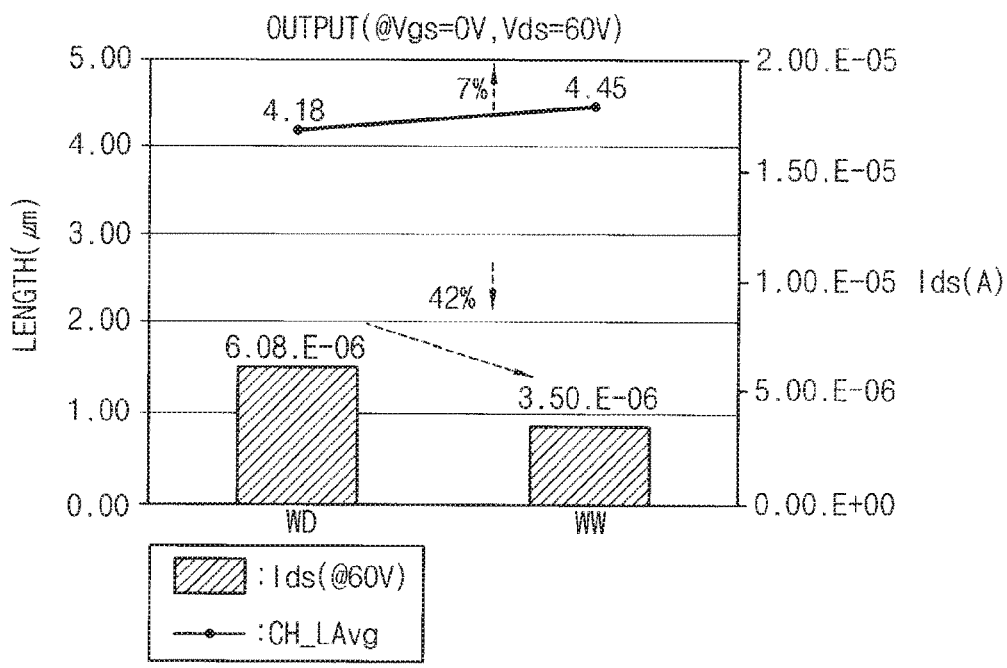
FIGS. 6A and 6B are graphs illustrating a drain-source current according to a length of the transistor in FIG. 2 according to exemplary embodiments of the present invention.
Figure 6B:
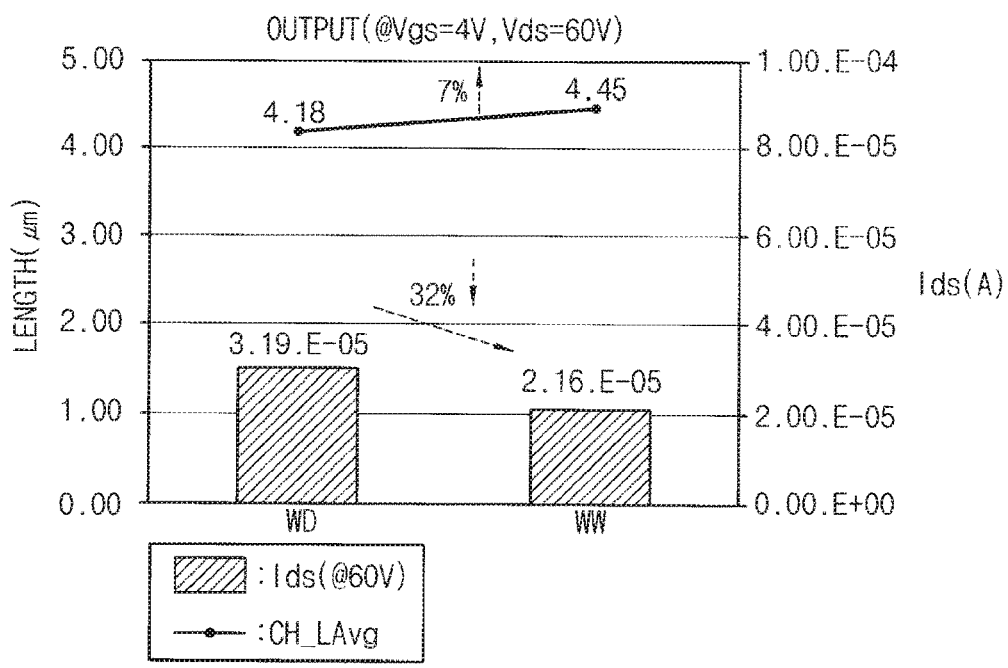

FIG. 6A and FIG. 6B are graphs illustrating a drain-source current according to a length of transistors in FIG. 2 according to exemplary embodiments of the present invention.

Referring to FIG. 3, FIG. 6A, and FIG. 6B, a metal layer is etched by a first etching process to form an electrode pattern to which the source and drain electrodes SE and DE are connected. The electrode pattern is etched by a second etching process to form the source and drain electrodes SE and DE spaced apart from each other. For example, the first and second etching processes are respectively a wet etching and a dry etching (hereinafter referred to as a wet-dry etching WD), or, in some cases the first and second etching processes may be wet etching (hereinafter referred to as a wet-wet etching WW).

Referring to FIG. 6A, the drain-source current is changed according to the channel length of a transistor when the gate-source voltage is about 0 V and the drain-source voltage is about 60 V. As shown in FIG. 6A, the channel length of a transistor formed via the wet-dry etching WD may have a mean value of about 4.18 μm, and the channel length of a transistor formed via the wet-wet etching WW may have a mean value of about 4.45 μm. Thus, the channel length of the transistor formed via wet-wet etching WW may be larger by about 7%, compared to the channel length of the transistor formed via wet-dry etching WD.

The mean value of the drain-source current Ids of the transistor having the relatively shorter channel length formed via the wet-dry etching WD may be about 6.08E-6 A. The mean value of the drain-source current Ids of the transistor having the relatively longer channel length formed via the wet-wet etching WW may be about 3.50E-6 A. Thus, if the channel length is increased by about 7%, the drain-source current Ids may decrease by about 42%.

Accordingly, in the transistor having a gate-source voltage of about 0 V and a drain-source voltage of about 60 V, the drain-source current Ids may decrease as the channel length increases.

The characteristics of a transistor explained with reference to FIG. 6A may apply to the fourth, sixth and ninth transistors T4, T6 and T9 connected to the Q node Q.

Thus, if the channel length of the fourth transistor T4 is increased, the drain-source current Ids of the fourth transistor T4 may decrease, and a signal loss of the Q node Q may decrease. When the channel length of each of the fourth and sixth transistors T4 and T6 is increased, the signal loss of the Q node Q may further decrease. Further, when the channel length of each of the fourth, sixth and ninth transistors T4, T6 and T9 is increased, the signal loss of the Q node Q may further decrease.

Referring to FIG. 6B, the drain-source current is changed according to the channel length of a transistor when the gate-source voltage is about 4 V and the drain-source voltage is about 60 V. As shown in FIG. 6B, the channel length of a transistor formed via the wet-dry etching WD may have a mean value of about 4.18 μm, and the channel length of the transistor formed via the wet-wet etching WW may have a mean value of about 4.45 μm. Thus, the channel length of the transistor formed via the wet-wet etching WW is be larger by about 7%, compared to the channel length of the transistor formed via the wet-dry etching WD.

The mean value of the drain-source current Ids of the transistor having the relatively shorter channel length formed via the wet-dry etching WD may be about 3.19E-5 A. The mean value of the drain-source current Ids of the transistor having the relatively longer channel length formed via the wet-wet etching WW may be about 2.16E-5 A. Thus, if the channel length is increased by about 7%, the drain-source current Ids may decrease by about 32%.

In the transistor having the gate-source voltage of about 4 V and the drain-source voltage of about 60 V, the drain-source current Ids may decrease as the channel length increases. The drain-source current Ids is about 3.50E-6 A in FIG. 6A, and the drain-source Ids is about 2.16E-5 A in FIG. 6B, the former being larger by an order of about 1. Thus, for a transistor having a gate-source voltage of about 4 V and a drain-source voltage of about 60 V, the channel length is recommended not to be less than about 4 μm to decrease the drain-source current Ids.

The characteristic of the transistor explained referring to FIG. 6B may be applied to the tenth transistor T10 connected to the Q node Q.

Accordingly, when the channel length of the tenth transistor T10 is increased, the drain-source current Ids may decrease and the signal loss of the Q node Q may decrease. In addition, the channel length of the tenth transistor T10 may be recommended not to be less than 4 μm.

Referring to FIG. 6A and FIG. 6B, when the channel length of each of the fourth, sixth, ninth and tenth transistors T4, T6, T9, and T10 connected to the Q node Q, is increased, the signal loss of the Q node Q may decrease. Thus, the signal loss of the Q node Q may be prevented during the boost-up period, and the gate signal controlled by the Q node Q may be more reliable.

Figure 7:
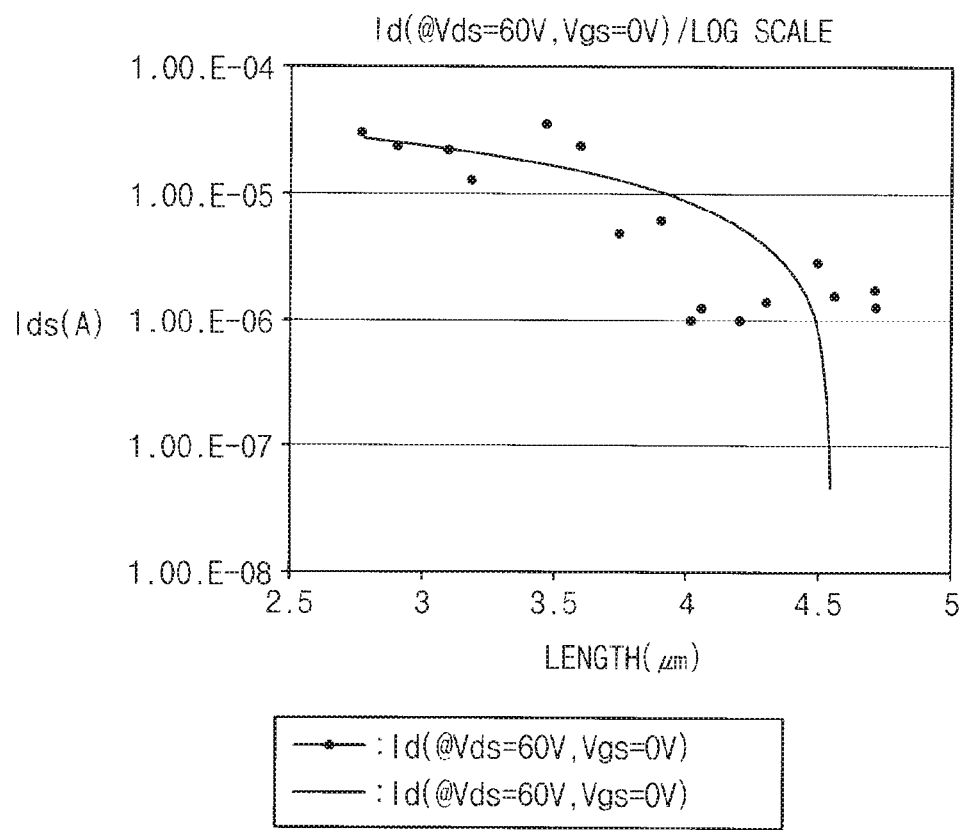
FIG. 7 is a graph illustrating a channel length and a drain-source current according to a manufacturing process for the transistor in FIG. 2 according to exemplary embodiments of the present invention.

FIG. 7 is a graph illustrating a channel length and a drain-source current according to a manufacturing process for a transistor in FIG. 2 according to exemplary embodiments of the present invention.

Referring to FIG. 2 and FIG. 7, in a transistor having a drain-source voltage Vds of about 60 V and a gate-source voltage Vgs of about 0 V, the drain-source current Ids was measured according to the channel length of the transistor.

If the channel length is not more than about 3.5 μm, the drain-source current Ids may be in a range between about 1.00E-4 A and about 1.00E-5 A. If the channel length is about 4.5 μm, the drain-source current Ids may dramatically decrease. If the channel length is in a range between about 4 μm and about 5 μm, the drain-source current Ids is in a range close to about 1.00E-6 A.

Conventionally, in manufacturing an active pattern and source and drain electrodes with one mask (maskless process), a first photoresist pattern having a first thickness may be formed in an area in which the source and drain electrodes are formed and a second photoresist pattern having a second thickness may be formed in a channel area, using a mask having a slit pattern or a half-tone pattern in the channel area between the source and drain electrodes. The second thickness may be smaller than the first thickness.

Then, the second photoresist pattern having the second thickness may be removed and the first photoresist pattern may be partially removed, using an etching back process. The source and drain electrodes and the channel may be formed using the first photoresist pattern having a reduced thickness. For example, as the thickness of the second photoresist pattern is decreased compared to the thickness of the first photoresist pattern, the channel length increases. However, a maximum possible channel length is about 0.5 μm.

At least one of the fourth, sixth, ninth and tenth transistors T4, T6, T9, and T10 connected to the Q node Q may be formed to have a channel length between about 4 μm and about 5 μm, and thus the signal of the Q node Q may be prevented from being lost during the boost-up period.

Figure 8:
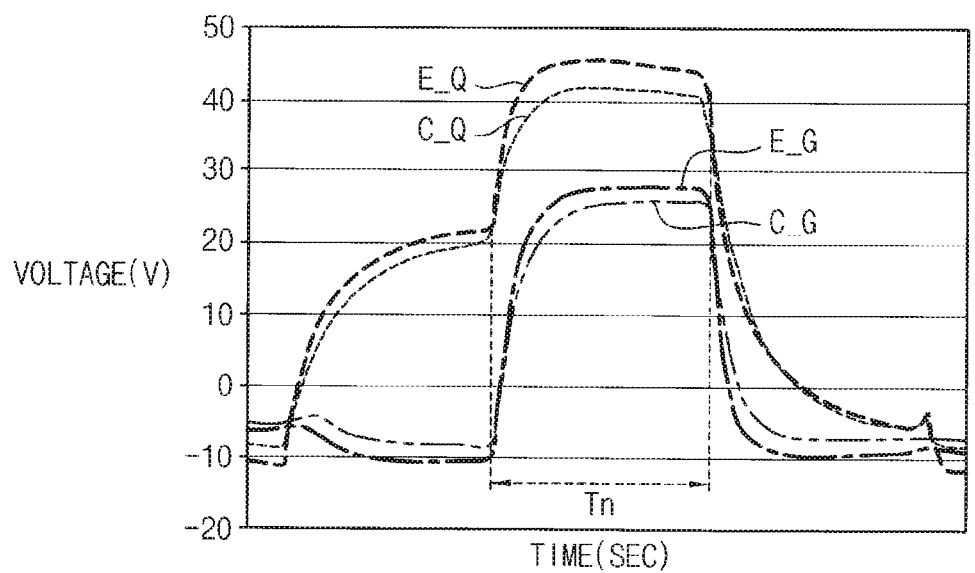
FIG. 8 is a graph illustrating a signal of a Q node and a gate signal according to the stage in FIG. 2 according to exemplary embodiments of the present invention.

FIG. 8 is a graph illustrating a signal of a Q node and a gate signal according to the stage in FIG. 2 according to exemplary embodiments of the present invention.

Referring to FIG. 2 and FIG. 8, in a comparative example, the channel length of each of the fourth, sixth, ninth and tenth transistors T4, T6, T9, and T10 connected to the Q node Q is about 3.5 μm. In the present exemplary embodiment, the channel length of each of the fourth, sixth, ninth and tenth transistors T4, T6, T9, and T10 connected to the Q node Q is about 4 μm, which is longer than that in the comparative example.

In the n-th period Tn, which is the boost-up period, the Q node Q according to the comparative example and the Q node Q according to the present exemplary embodiment can be measured. As illustrated in FIG. 8, the signal of the Q node C_Q has a high level of about 42 V in the comparative example, and the signal of the Q node E_Q had the high level of about 45 V in the present exemplary embodiment. Accordingly, the signal of the Q node E_Q in the present exemplary embodiment has a higher level than the signal of the Q node C_Q in the comparative example.

The signal of the Q node effects an output waveform of the gate signal. In the n-th period Tn, which is the boost-up period, the high level of the gate signal C_G in the comparative example is about 26 V, and the high level of the gate signal E_G in the present exemplary embodiment is about 28 V. In addition, a delaying period in which the gate signal drops from the high level to the low level is shortened in the present exemplary embodiment, compared to the comparative example. Thus, the gate signal E_G in the present exemplary embodiment has an improved characteristic compared to the gate signal C_G in the comparative example.

The channel length of each of the fourth, sixth, ninth and tenth transistors T4, T6, T9, and T10 connected to the Q node can be increased, so that the signal level of the Q node and the delaying period can be increased during the boost-up period. Thus, the high level of the gate signal and the delaying period may improve.

Although not shown in the figure, when the channel length of each of the fourth and tenth transistors T4 and T10 of the transistors connected to the Q node is about 4 μm, the signal level of the Q node Q increases during the boost-up period. For example, when the channel length of each of the fourth and tenth transistors T4 and T10 is about 4 μm, the high level of the gate signal and the delaying period may improve.

According to the present exemplary embodiment, at least one transistor connected to the Q node may have an elongated channel, so that the signal level of the Q node is increased during the boost-up period of the Q node. Thus, the high level of the gate signal outputted from the stage and the delaying period may be improved.

Figure 9:
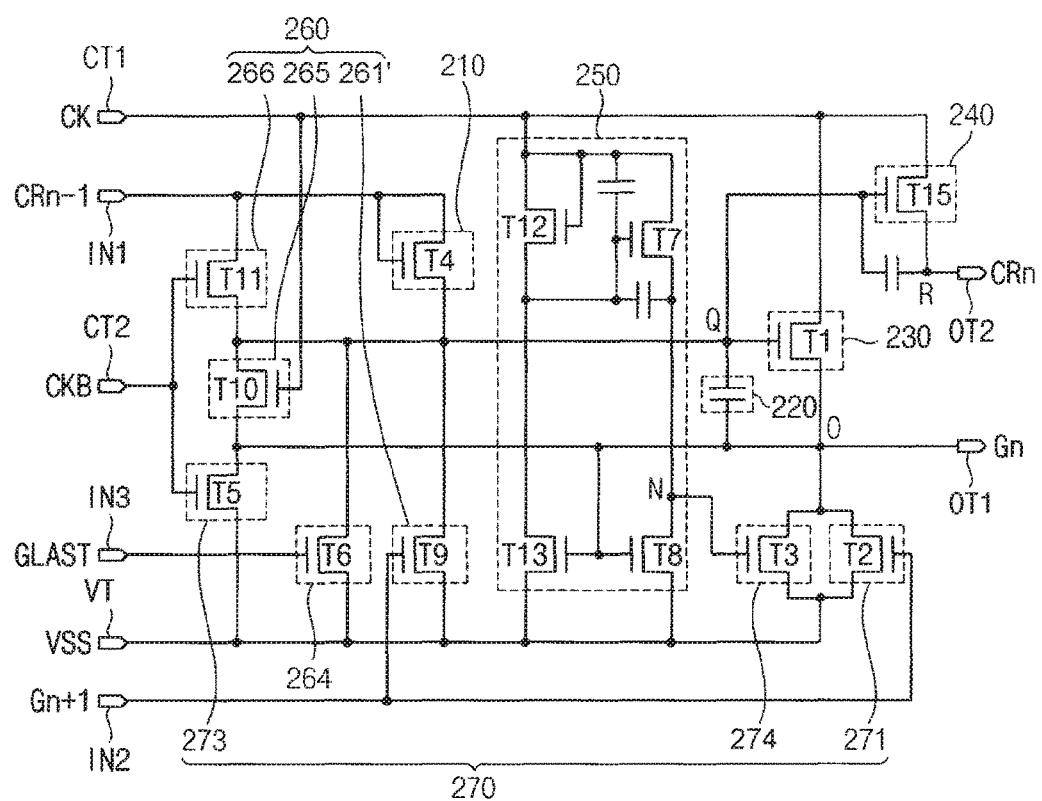
FIG. 9 is an equivalent circuit diagram of a stage according to exemplary embodiments of the present invention.

FIG. 9 is an equivalent circuit diagram of a stage according to exemplary embodiments of the present invention.

Hereinafter, the same reference numerals will be used to refer to the same or like parts as those described in the above-noted exemplary embodiments and any further repetitive explanation concerning the above-noted elements will be omitted.

Referring to FIG. 9, the n-th stage SRCn may include a first clock terminal CT1, a second clock terminal CT2, a first input terminal IN1, a second input terminal IN2, a third input terminal IN3, a voltage terminal VT, a first output terminal OT1, a second output terminal OT2, a buffer part 210, a charging/discharging part 220, a gate output part 230, a carry part 240, an inverting part 250, a first node control part 260, and a second node control part 270.

The first clock terminal CT1 receives a first clock signal or a second clock signal different from the first clock signal. For example, the first clock terminal CT1 receives the first clock signal CK.

The second clock terminal CT2 receives the second clock signal or the first clock signal different from the second clock signal. For example, the second clock terminal CT2 receives the second clock signal CKB.

For example, the first clock terminal CT1 of each of the odd-numbered stages SRC1, SRC3, SRC5, . . . may receive the first clock signal CK, and the second clock terminal CT2 thereof may receive the second clock signal CKB. The first clock terminal CT1 of each of the odd-numbered stage SRC2, SRC4, SRC6, . . . may receive the second clock signal CKB, and the second clock terminal CT2 thereof may receive the first clock signal CK. Hereinafter, the first clock signal CK is referred to as a clock signal, and the second clock signal CKB is referred to as a reverse clock signal.

The first input terminal IN1 receives at least one carry signal of a previous stage. For example, the first input terminal IN1 of an n-th stage may receive an (n−1)-th carry signal CRn−1 of the (n−1)-th stage. In the first stage SRC1, the first input terminal IN1 may receive the vertical start signal STV.

The second input terminal IN2 receives at least one gate signal of a next stage. For example, the second input terminal IN2 of the n-th stage may receive an (n+1)-th gate signal Gn+1 of the (n+1)-th stage.

The third input terminal IN3 receives a gate signal GLAST of a last stage of the stages included in the gate driving circuit.

The voltage terminal VT receives a low voltage VSS.

The first output terminal OT1 is electrically connected to the corresponding gate line, and outputs the n-th gate signal Gn. The first output terminal OT1 is connected to at least one stage of the subsequent stages, and the last stage is connected to the third input terminal IN3 of each of the previous stages.

The second output terminal OT2 outputs the n-th carry signal CRn. The second output terminal OT2 is connected to at least one stage of the subsequent stages.

Each of a plurality of transistors T1, T2, . . . , T15 of the n-th stage has a channel width and a channel length. At least one of the fourth, sixth, ninth, tenth and eleventh transistors T4, T6, T9, T10 and T11 connected to the Q node which is the control node of the n-th stage may have a channel length larger than that of the first transistor T1.

The transistors T1, T2, . . . , T15 of the n-th stage SRCn are driven by the buffer part 210, the charging/discharging part 220, the gate output part 230, the carry part 240, the inverting part 250, the first node control part 260, and the second node control part 270.

The buffer part 210 includes a fourth transistor T4 connected to the Q node Q. The buffer part 210 applies the high voltage of the (n−1)-th carry signal CRn−1 to the Q node Q. The channel length of the fourth transistor T4 is substantially the same as or larger than the channel length of the first transistor T1 included in the gate output part 230 by about 10% to about 50%. For example, the channel length of the fourth transistor T4 may be between about 3 μm and about 5 μm.

The charging/discharging part 220 discharges the first voltage V1 corresponding to the high voltage of the (n−1)-th carry signal CRn−1, in response to the (n−1)-th carry signal CRn−1. The charging/discharging part 220 may include any suitable charging/discharging element including, for example, a capacitor.

The gate output part 230 includes the first transistor T1 connected to the Q node Q. The gate output part 230 outputs the n-th gate signal Gn in response to the high voltage of the clock signal CK received at the first clock terminal CT1. The gate output part 230 may include the first transistor T1. The channel length of the first transistor T1 may be about 3.5 μm.

The carry part 240 includes the fifteenth transistor T15. The carry part 240 outputs the high voltage of the clock signal CK to the n-th carry signal CRn in response to the signal of the Q node. The channel length of the fifteenth transistor T15 may be about 3.5 μm.

The inverting part 250 may include the twelfth transistor T12, the seventh transistor T7, the thirteenth transistor T13 and the eighth transistor T8. The inverting part 250 applies the signal synchronized with the clock signal CK to the inverting node N. The clock signal CK is applied to the first clock terminal CT1 during a remaining period of the frame except for the n-th period in which the n-th gate signal Gn having the high voltage is outputted. The channel length of the twelfth transistor T12 may be about 15 μm. The channel length of the seventeenth transistor T17 may be about 3.5 μm. The channel length of the thirteenth transistor T13 may be about 3.5 μm. The channel length of the eighth transistor T8 may be about 3.5 μm.

The first node control part 260 includes a first discharging part 261', a first maintaining part 265, a second maintaining part 266 and a reset part 264, and controls the signal applied to the Q node Q.

The first discharging part 261' includes the ninth transistor T9. The ninth transistor T9 includes a control electrode connected to the second input terminal IN2, an input electrode connected to the Q node Q, and an output electrode connected to the voltage terminal VT. The first discharging part 261' discharges the voltage of the Q node Q to the low voltage VSS applied to the voltage terminal VT, in response to the high voltage of the (n+1)-th gate signal Gn+1. The channel length of the ninth transistor T9 connected to the Q node Q may be larger than that of the first transistor T1 by about 10% to about 50%. For example, the channel length of the ninth transistor T9 may be between about 4 μm and about 5 μm.

The first maintaining part 265 includes the tenth transistor T10. The tenth transistor T10 includes a control electrode connected to the first clock terminal CT1, an input electrode connected to the Q node Q, and an output electrode connected to the output node O. The first maintaining part 265 provides the voltage of the Q node Q to the voltage of the output node O, in response to the high voltage of the clock signal CK. The channel length of the tenth transistor T10 connected to the Q node Q may be larger than that of the first transistor T1 by about 10% to about 50%. For example, the channel length of the tenth transistor T10 may be between about 4 μm and about 5 μm.

The second maintaining part 266 includes the eleventh transistor T11. The eleventh transistor T11 includes a control electrode connected to the second clock terminal CT2, an input electrode connected to the Q node Q, and an output electrode connected to the first input terminal IN1. The second maintaining part 266 provides the signal of the Q node Q to the low level of the (n−1)-th carry signal CRn−1, in response to the high voltage of the reversed clock signal CKB. The channel length of the eleventh transistor T11 connected to the Q node Q may be larger than that of the first transistor T1 by about 10% to about 50%. For example, the channel length of the eleventh transistor T11 may be between about 4 μm and about 5 μm.

The reset part 264 includes a sixth transistor T6. The sixth transistor T6 includes a control electrode connected to the third input terminal IN3, an input electrode connected to the Q node Q, and an output electrode connected to the voltage terminal VT. The reset part 264 resets the signal of the Q node Q to the low voltage VSS, in response to the high voltage of the last gate signal GLAST. The channel length of the sixth transistor T6 connected to the Q node Q may be larger than that of the first transistor T1 by about 10% to about 50%. For example, the channel length of the sixth transistor T6 may be between about 4 μm and about 5 μm.

The second node control part 270 includes a third discharging part 271, a third maintaining part 272 and a fourth maintaining part 273, and controls the signal applied to the output node O.

The third discharging part 271 includes the second transistor T2. The second transistor T2 includes a control electrode connected to the second input terminal IN2, an input electrode connected to the output node O, and an output electrode connected to the voltage terminal VT. The third discharging part 271 discharges the signal of the output node O which is the n-th gate signal Gn to the low voltage VSS, in response to the high voltage of the (n+1)-th gate signal Gn+1. The channel length of the second transistor T2 may be about 3.5 μm.

The third maintaining part 272 includes the third transistor T3. The third transistor T3 includes a control electrode connected to the inverting node N, an input electrode connected to the output node O, and an output electrode connected to the voltage terminal VT. The third maintaining part 272 provides the n-th gate signal Gn to the low voltage VSS in response to the high voltage of the inverting node N. The channel length of the third transistor T3 may be about 3.5 μm.

The fourth maintaining part 273 includes the fifth transistor T5. The fifth transistor T5 includes a control electrode connected to the second clock terminal CT2, an input electrode connected to the output node O, and an output electrode connected to the voltage terminal VT. The fourth maintaining part 273 maintains the n-th gate signal Gn to the low voltage VSS in response to the high voltage of the reversed clock signal CKB. The channel length of the fifth transistor T5 may be about 3.5 μm.

FIG. 10A, FIG. 10B, FIG. 10C, FIG. 10D and FIG. 10E are circuit diagrams of a transistor operated during a boost-up period in FIG. 9 according to exemplary embodiments of the present invention.

Figure 10A:
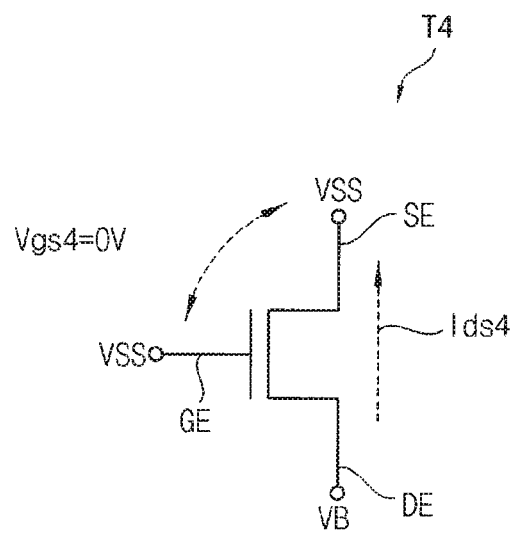
FIGS. 10A, 10B, 10C, 10D, and 10E are circuit diagrams of a transistor operated during a boost-up period in FIG. 9 according to exemplary embodiments of the present invention.

Referring to FIG. 4 and FIG. 10A, in the n-th period Tn which is the boost-up period of the Q node Q, the low voltage VSS of the (n−1)-th carry signal CRn−1 is applied to the gate and source electrodes GE and SE of the fourth transistor T4, and the boosted up second voltage VB is applied to the drain electrode DE. The fourth transistor T4 has a gate-source voltage Vgs4 of about 0 V between the gate and source electrodes GE and SE, and has a drain-source current Ids4 flowing between the drain and source electrode DE and SE. The channel length of the fourth transistor T4 is larger than the channel length of the first transistor. For example, the channel length of the fourth transistor T4 may be between about 4 μm and about 5 μm. Thus, the drain-source current Ids4 may be decreased.

During the (n−1)-th period, the fourth transistor T4 provides the first voltage V1 to the Q node Q for the boost-up driving. The elongated channel length of the fourth transistor T4 may cause the bad driving, so that the boost-up driving may malfunction. If, the channel length of the fourth transistor T4 is between about 4 μm and 5 μm, which is larger than that of the first transistor T1, bad driving and the malfunction of the boost-up driving may not occur. In some cases, the channel length of the fourth transistor T4 may be about 3.5 µm, which is substantially the same as the channel length of the first transistor T1, and the fourth transistor T4 may not provide the driving margin.

Figure 10B:
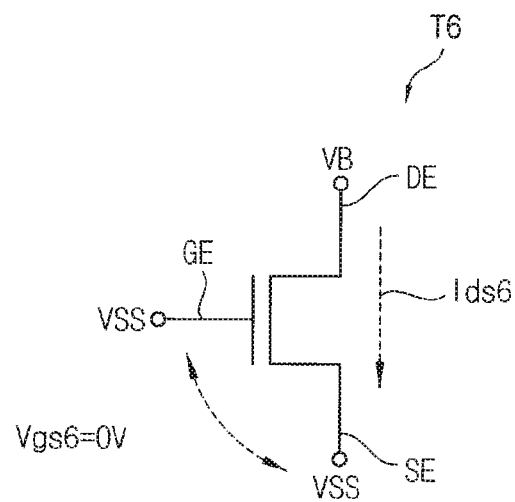

Referring to FIG. 4 and FIG. 10B, in the n-th period Tn, the low voltage VSS of the last gate signal GLAST is applied to the gate electrode GE of the sixth transistor T6, the second voltage VB is applied to the drain electrode DE of the sixth transistor T6, and the low voltage VSS received at the voltage terminal VT is applied to the source electrode SE of the sixth transistor T6. The sixth transistor T6 has a gate-source voltage Vgs6 of about 0 V between the gate and source electrodes GE and SE, and a drain-source current Ids6 flowing between the drain and source electrodes DE and SE. The channel length of the sixth transistor T6 is larger than that of the first transistor T1, and results in a decrease in the drain-source current Ids6. For example, the channel length of the sixth transistor T6 may be between about 4 µm and 5 µm.

Figure 10C:
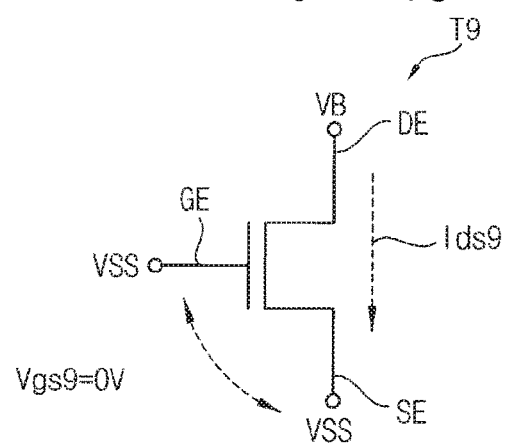

Referring to FIG. 4 and FIG. 10C, in the n-th period Tn, the low voltage VSS of the (n+1)-th gate signal Gn+1 is applied to the gate electrode GE of the ninth transistor T9, the second voltage VB is applied to the drain electrode DE of the ninth transistor T9, and the low voltage VSS received to the voltage terminal VT is applied to the source electrode SE of the ninth transistor T9. The ninth transistor T9 has a gate-source voltage Vgs9 of about 0 V between the gate and source electrodes GE and SE, and a drain-source current Ids9 flowing between the drain and source electrodes DE and SE. The channel length of the ninth transistor T9 is larger than that of the first transistor T1, and results in a decrease in the drain-source current Ids9. For example, the channel length of the ninth transistor T9 may be between about 4 µm and 5 µm.

Figure 10D:
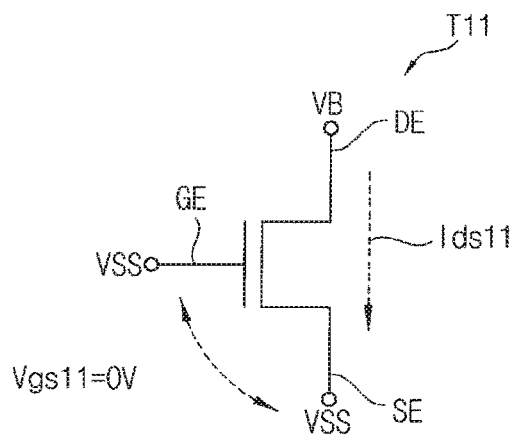

Referring to FIG. 4 and FIG. 10D, in the n-th period Tn, the low voltage VSS of the reversed clock signal CKB is applied to the gate electrode GE of the eleventh transistor T11, the second voltage VB is applied to the drain electrode DE of the eleventh transistor T11, and the low voltage VSS of the (n−1)-th carry signal CRn−1 is applied to the source electrode SE of the eleventh transistor T11. The eleventh transistor T11 has a gate-source voltage Vgs11 of about 0 V between the gate and source electrodes GE and SE, and a drain-source current Ids11 flowing between the drain and source electrodes DE and SE. The channel length of the eleventh transistor T11 is larger than that of the first transistor T1, and results in a decrease in the drain-source current Ids11. For example, the channel length of the eleventh transistor T11 may be between about 4 µm and 5 µm.

Figure 10E:
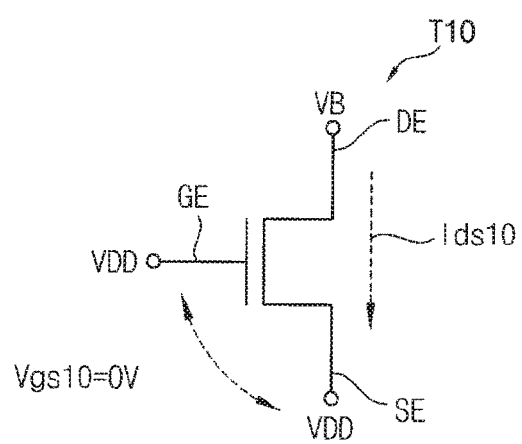

Referring to FIG. 4 and FIG. 10E, in the n-th period Tn, the high voltage VDD of the clock signal CK is applied to the gate electrode GE of the tenth transistor T10, the second voltage VB is applied to the drain electrode DE of the tenth transistor T10, and the high voltage VDD of the output node O is applied to the source electrode SE of the tenth transistor T10. The tenth transistor T10 has a gate-source voltage Vgs10 of about 0 V between the gate and source electrodes GE and SE, and a drain-source current Ids10 flowing between the drain and source electrodes DE and SE. The channel length of the tenth transistor T10 is larger than that of the first transistor T1, and results in a decrease in the drain-source current Ids10. For example, the channel length of the tenth transistor T10 may be between about 4 µm and 5 µm.

According to the exemplary embodiments of the invention, at least one of the fourth, sixth, ninth, tenth and eleventh transistors T4, T6, T9, T10, and T11 connected to the Q node Q may have an elongated channel, so that the signal level of the Q node increases during a boost-up period of the Q node. Thus, the gate signal may have an improved high level and an improved delay period.

According to the exemplary embodiments of the present invention, at least one transistor connected to a Q node which is a control node of a stage may have an elongated channel, so that a signal level of the Q node increases during a boost-up period of the Q node. Thus, the gate signal outputted from the stage may have an improved high level and an improved delay period.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A gate driving circuit, comprising:
 a plurality of stages connected with each other and configured to output a plurality of gate signals, an n-th stage, wherein n is a natural number, comprising:
 a gate output part comprising a first transistor connected between a clock signal and an output node outputting an n-th gate signal, the first transistor having a gate electrode connected to a control node;
 a carry part connected between the clock signal and a carry node outputting an n-th carry signal;
 a first node control part connected between the output node and a first low voltage; and
 a second node control part comprising a second transistor connected between the control node and a second low voltage different from the first low voltage, the second transistor having a gate electrode receiving an (n+1)-th carry signal provided from a carry part of an (n+1)-th stage after the n-th stage,
 wherein the second transistor has a channel length longer than a channel length of the first transistor.

2. The gate driving circuit of claim 1, wherein the first low voltage has a first low level, and
 the second low voltage has a second low level lower than the first low level of the first low voltage.

3. The gate driving circuit of claim 2, wherein the first low level corresponds to a discharging level of the n-th gate signal, and the second low level corresponds to a discharging level of the control node.

4. The gate driving circuit of claim 1, wherein:
 the second transistor is configured to discharge a signal of the control node to the second low voltage in response to the (n+1)-th carry signal provided from the carry part of the (n+1)th stage after the n-th stage.

5. The gate driving circuit of claim 1, wherein the second node control part further comprises:
 a sixth transistor configured to discharge the signal of the control node to the second low voltage in response to an (n+2)-th carry signal provided from a carry part of an (n+2)-th stage after the (n+1)-th stage, the sixth transistor having a channel length longer than the channel length of the first transistor.

6. The gate driving circuit of claim 5, wherein the second node control part further comprises:
 a tenth transistor configured to provide the signal of the control node to the second low voltage in response to a signal of an inverting node, the tenth transistor having a channel length longer than the channel length of the first transistor.

7. The gate driving circuit of claim 1, wherein the first node control part comprises:
   a third transistor connected between the output node and the first low voltage, the third transistor having a gate electrode connected to the (n+1)-th carry signal provided from the carry part of the (n+1)-th stage after the n-th stage; and
   a fourth transistor connected between the output node and the first low voltage, the fourth transistor having a gate electrode connected to an inverting node.

8. The gate driving circuit of claim 1, wherein the n-th stage further comprises:
   a buffer part comprising a fifth transistor connected between the control node and an (n−1)-th carry signal provided from a carry part of an -(n−1)-th stage prior to the n-th stage, the fifth transistor having a channel length longer than the channel length of the first transistor.

9. The gate driving circuit of claim 1, wherein the n-th stage further comprises:
   a third node control part comprising a sixth transistor connected between an inverting node and the second low voltage, the sixth transistor having a channel length longer than the channel length of the first transistor and the channel length of the second transistor.

* * * * *